United States Patent
Lu et al.

(10) Patent No.: US 10,199,506 B2
(45) Date of Patent: Feb. 5, 2019

(54) LOW TEMPERATURE POLY-SILICON TRANSISTOR ARRAY SUBSTRATE AND FABRICATION METHOD THEREOF, AND DISPLAY DEVICE

(71) Applicant: BOE TECHNOLOGY GROUP CO., LTD., Beijing (CN)

(72) Inventors: Xiaoyong Lu, Beijing (CN); Zheng Liu, Beijing (CN); Xiaolong Li, Beijing (CN); Dong Li, Beijing (CN); Huijuan Zhang, Beijing (CN); Liang Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/084,802

(22) Filed: Mar. 30, 2016

(65) Prior Publication Data
US 2016/0300957 A1    Oct. 13, 2016

(30) Foreign Application Priority Data
Apr. 10, 2015    (CN) .......................... 2015 1 0169378

(51) Int. Cl.
H01L 29/786    (2006.01)
H01L 29/66    (2006.01)

(52) U.S. Cl.
CPC .. *H01L 29/78675* (2013.01); *H01L 29/66757* (2013.01); *H01L 29/78621* (2013.01); *H01L 29/78627* (2013.01); *H01L 2029/7863* (2013.01)

(58) Field of Classification Search
CPC ......... H01L 29/78675; H01L 29/78672; H01L 29/78621; H01L 29/78609;
(Continued)

(56) References Cited

U.S. PATENT DOCUMENTS 6,335,555 B1 * 1/2002 Takemura ......... H01L 29/66757
257/347
6,794,277 B2    9/2004 Machida et al.
(Continued)

FOREIGN PATENT DOCUMENTS

CN    1257307 A    6/2000
CN    1401134 A    3/2003

OTHER PUBLICATIONS

Xiong, Z. "Characteristics of High-K Spacer Offset-Gated Polysilicon TFTs" IEEE Trans. on Elec. Dev. vol. 51, No. 8 Aug. 2004 pp. 1304-1308.*
(Continued)

*Primary Examiner* — Asok K Sarkar
*Assistant Examiner* — Grant Withers
(74) *Attorney, Agent, or Firm* — Nath, Goldberg & Meyer; Joshua B. Goldberg

(57) ABSTRACT

The embodiments of the present invention disclose a low temperature poly-silicon (LTPS) transistor array substrate and a method of fabricating the same, and a display device. The LTPS transistor array substrate comprises a substrate; a poly-silicon semiconductor active region provided on the substrate; a gate insulated from the poly-silicon semiconductor active region; and a dielectric spacer region provided on a side wall of the gate, wherein a portion of the poly-silicon semiconductor active region corresponding to the dielectric spacer region comprises a buffer region, and the dielectric spacer region surrounds the side wall of the gate and covers the buffer region.

9 Claims, 5 Drawing Sheets

(58) Field of Classification Search
CPC ......... H01L 29/78606; H01L 29/78627; H01L 29/66757; H01L 2029/7863
See application file for complete search history.

(56) References Cited

U.S. PATENT DOCUMENTS

| | | | |
|---|---|---|---|
| 9,627,460 B2 | 4/2017 | Yamazaki | |
| 2002/0105033 A1* | 8/2002 | Zhang | H01L 27/1214 257/353 |
| 2003/0077886 A1* | 4/2003 | Machida | H01L 21/223 438/535 |
| 2003/0104659 A1 | 6/2003 | Arakawa et al. | |
| 2006/0197088 A1* | 9/2006 | Isobe | H01L 29/42384 257/59 |

OTHER PUBLICATIONS

Kobayashi, K. "A Novel Fabrication Method for polycrystalline Silicon Thin-Film Transistors with a Self-Aligned Lightly Doped Drain Structure" Jpn. J. Appl. Phys. vol. 32 Part 1, No. 1B Jan. 1993 pp. 469-473.*
Office Action dated May 16, 2017 issued in corresponding Chinese Application No. 201510169378.9.

* cited by examiner

LOW TEMPERATURE POLY-SILICON TRANSISTOR ARRAY SUBSTRATE AND FABRICATION METHOD THEREOF, AND DISPLAY DEVICE

FIELD OF THE INVENTION

The present invention relates to the field of display technology, and particularly relates to a low temperature poly-silicon (LTPS) transistor array substrate and a method of fabricating the same, and a display device.

BACKGROUND OF THE INVENTION

As shown in FIG. 1 and FIG. 2, a low temperature poly-silicon (LTPS) transistor array substrate in the prior art comprises a substrate 1, a poly-silicon semiconductor active region 2 provided on the substrate 1, and a gate 4 insulated from the poly-silicon semiconductor active region 2, wherein a gate insulating layer 3 is provided between the gate 4 and the poly-silicon semiconductor active region 2, and the gate insulating layer 3 is etched twice during respectively forming patterns of the gate insulating layer 3 and the gate 4 through patterning processes. As a result, the gate insulating layer 3 has reduced density, and has an interface defect at the interface in contact with the poly-silicon semiconductor active region 2.

As shown in FIG. 1, an LTPS transistor array substrate comprising an N-type metal-oxide-semiconductor (NMOS) transistor further comprises a source-drain extension region 5 and a source-drain doping region 6 which are successively provided at each of both sides of the poly-silicon semiconductor active region 2, wherein firstly, the source-drain extension regions 5 (comprising formed low energy shallow junctions) are formed by implanting medium or low dose of ions such as phosphorus or arsenic ions by using a mask of the gate 4, and then the source-drain doping regions 6 are formed by implanting large dose of dopant ions with a mask.

The source-drain extension region 5 forms a gradually varied lateral ion concentration gradient between the source-drain doping region 6 of high ion concentration and a channel region of the poly-silicon semiconductor active region 2 of low ion concentration. The lateral ion concentration gradient of the source-drain extension region 5 decreases the electric field between the junction and the channel region, and separates a position with maximum electric field in the junction from a path with maximum current in the channel, in order not to generate hot carriers.

However, even if the source-drain extension region 5 is provided, the leakage current in the source-drain extension region 5 and the poly-silicon semiconductor active region 2 is still large, especially in a portion of the source-drain extension region 5 in contact with the poly-silicon semiconductor active region 2.

As shown in FIG. 2, the LTPS transistor array substrate comprising a P-type metal-oxide-semiconductor (PMOS) transistor further comprises a source-drain doping region 6 provided on each of both sides of the poly-silicon semiconductor active region 2, wherein the source-drain doping regions 6 are formed by large dose implantation. In this case, there is no gradually varied lateral concentration gradient between the source-drain doping region 6 and the poly-silicon semiconductor active region 2. Therefore, the concentration gradient is large, and hot carriers are easily generated.

SUMMARY OF THE INVENTION

An object of the present invention is to solve problems of large dopant ion concentration gradient, easily generated hot carriers and leakage current between a channel region of a poly-silicon semiconductor active region and a source-drain extension region or source-drain doping region in the prior art, and to provide a low temperature poly-silicon (LTPS) transistor array substrate and a method of fabricating the same, and a display device, which are capable of preventing the generation of hot carriers.

According to one aspect of the present invention, there is provided art LTPS transistor array substrate, comprising: a substrate; a poly-silicon semiconductor active region provided on the substrate; a gate insulated from the poly-silicon semiconductor active region; and a dielectric spacer region provided on a side wall of the gate. A portion of the poly-silicon semiconductor active region corresponding to the dielectric spacer region comprises a buffer region, and the dielectric spacer region surrounds the side wall of the gate and covers the buffer region.

The LTPS transistor array substrate may further comprise a gate insulating layer, which is provided between the gate and the poly-silicon semiconductor active region and has the same pattern as the gate.

A maximum length of the dielectric spacer region from a side close to the gate to a side far away from the gate may be in the range of 0.1 µm to 1 µm.

The dielectric spacer region may comprise at least one layer of dielectric material.

The dielectric material may be silicon oxide or silicon nitride.

The LTPS transistor array substrate may further comprise a source-drain extension region provided at a side of the buffer region far away from the poly-silicon semiconductor active region and the source-drain extension region comprises small amount of dopant ions. The LTPS transistor array substrate may further comprise a source-drain doping region provided at a side of the source-drain extension region far away from the poly-silicon semiconductor active region, and the source-drain doping region comprises large amount of dopant ions.

The LTPS transistor array substrate may further comprise a source-drain doping region provided at a side of the buffer region far away from the poly-silicon semiconductor active region, and the source-drain doping region comprises large amount of dopant ions.

According to another aspect of the present invention, a method for fabricating the above described LTPS transistor array substrate is provided, comprising: forming a poly-silicon semiconductor active layer on a substrate; forming a gate insulating layer on the poly-silicon semiconductor active layer; forming a gate layer on the gate insulating layer; forming patterns of the gate insulating layer and a gate by a patterning process; forming a dielectric layer on the substrate formed with the pattern of the gate, and forming a dielectric spacer region on a side wall of the gate by a patterning process; and defining a poly-silicon semiconductor active region in the poly-silicon semiconductor active layer and forming a buffer region in a portion of the poly-silicon semiconductor active region corresponding to the dielectric spacer region by ion implantation, wherein the dielectric spacer region surrounds the side wall of the gate and covers the buffer region.

In the method, the poly-silicon semiconductor active region is defined in portions of the poly-silicon semiconductor active layer corresponding to the gate and the dielectric spacer region, and the buffer region is formed in the portion of the poly-silicon semiconductor active region corresponding to the dielectric spacer region, by ion implantation.

A maximum length of the dielectric spacer region from a side close to the gate to aside far away from the gate may be in the range of 0.1 μm to 1 μm.

The dielectric spacer region may comprise at least one layer of dielectric material.

The dielectric material may be silicon oxide or silicon nitride.

In the method, a source-drain extension region is formed in a portion, rather than the poly-silicon semiconductor active region, of the poly-silicon semiconductor active layer by ion implantation, wherein the source-drain extension region comprises small amount of dopant ions. The method may further comprise forming, in the poly-silicon semiconductor active layer, a source-drain doping region at a side of the source-drain extension region far away from the poly-silicon semiconductor active region by implanting large amount of dopant ions, wherein the source-drain doping region comprises large amount of dopant ions.

The method may further comprise forming a source-drain doping region in a portion, other than the poly-silicon semiconductor active region, of the poly-silicon semiconductor active layer by implanting large amount of dopant ions, wherein the source-drain doping region comprises large amount of dopant ions.

According to still another aspect of the present invention, there is provided a display device comprising the above described LTPS transistor array substrate.

In the LTPS transistor array substrate, the method of fabricating the LTPS transistor array substrate and the display device according to embodiments of the present invention, since the dielectric spacer region is formed on the side wall of the gate, and the buffer region is formed in the portion of the poly-silicon semiconductor active region corresponding to the dielectric spacer region, the buffer regions can effectively prevent current leakage caused by hot carrier effect. Meanwhile, the gate insulating layer and the gate are formed by one patterning process, which can improve interface defect of the gate insulating layer. In addition, the dielectric spacer region may further protect side walls of the gate insulating layer and the gate from being damaged by subsequent fabrication processes of functional layers.

DETAIL DESCRIPTION OF THE EMBODIMENTS

To make those skilled in the art understand the technical solutions of the present invention better, the present invention skill be further described in detail as below in conjunction with the accompanying drawings and specific implementations.

Figure 1:
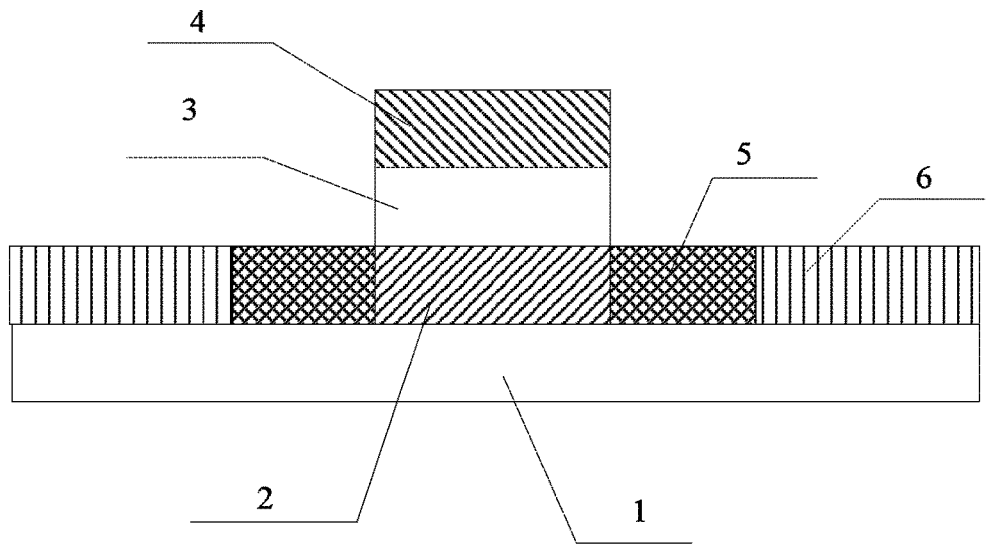
FIG. 1 is a schematic structure diagram of an NMOS region of an LTPS transistor array substrate in the prior art.
Figure 2:
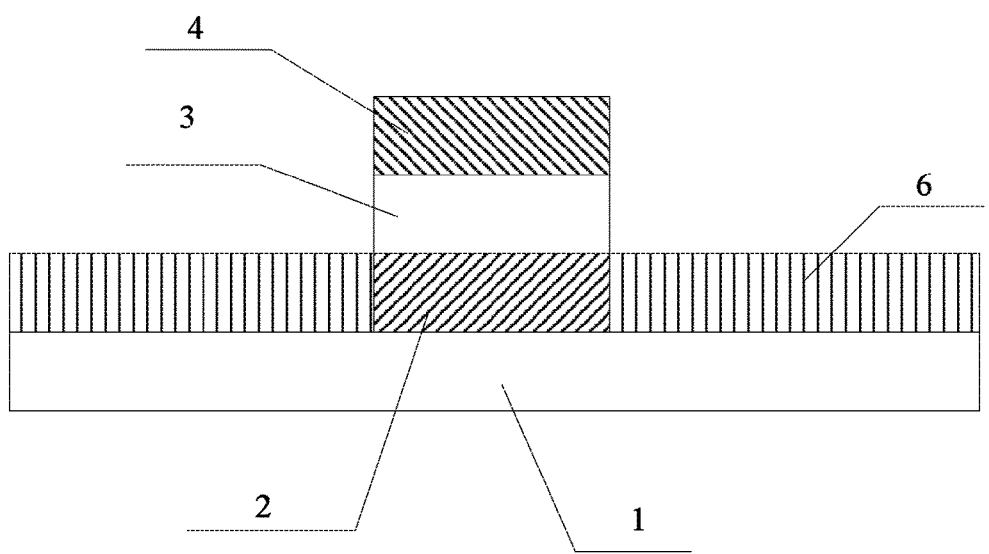
FIG. 2 is a schematic structure diagram of a PMOS region of an LTPS transistor array substrate in the prior art.
Figure 3:
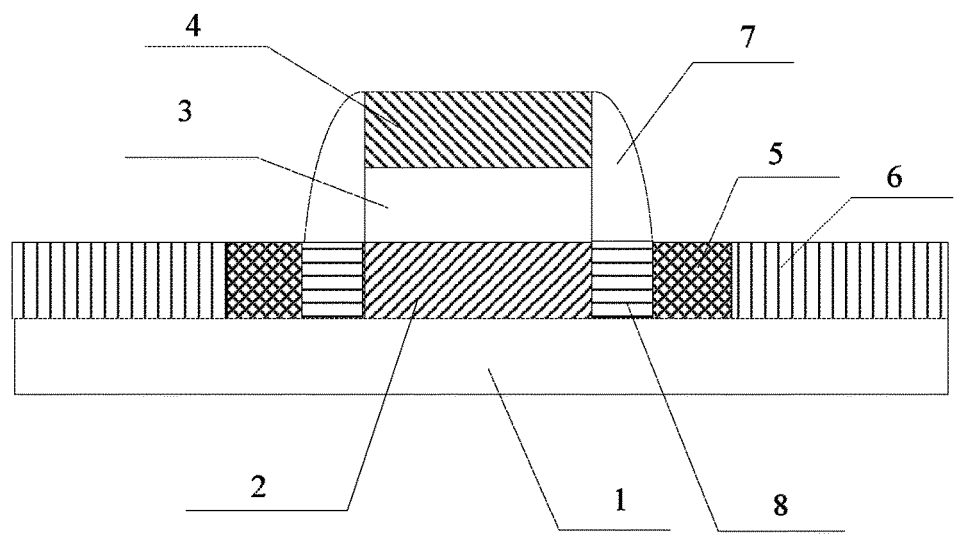
FIG. 3 is a schematic structure diagram of an NMOS region of an LTPS transistor array substrate according to an embodiment of the present invention.
Figure 4:
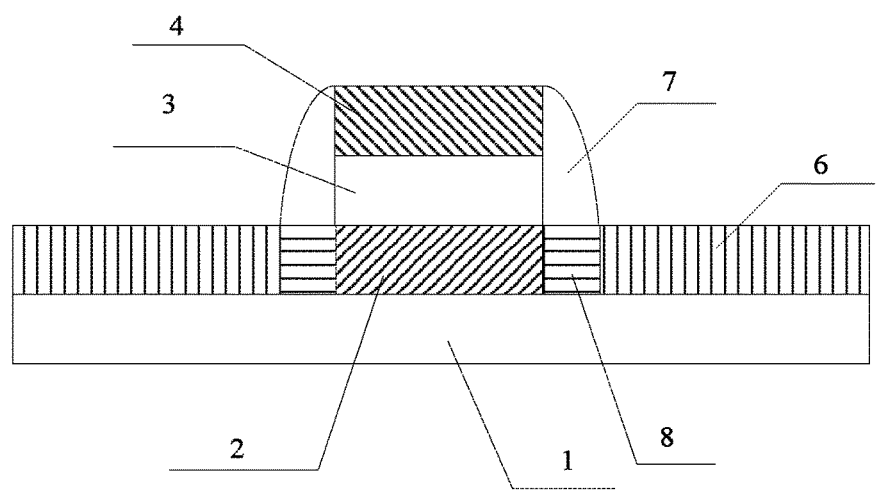
FIG. 4 is a schematic structure diagram of a PMOS region of an LTPS transistor array substrate according to an embodiment of the present invention.

As shown in FIG. 3 and FIG. 4, the embodiments of the present invention provide an LTPS transistor array substrate, comprising: a substrate 1; a poly-silicon semiconductor active region 2 provided on the substrate 1; a gate 4 provided to be insulated from the poly-silicon semiconductor active region 2; and a dielectric spacer region 7 provided on a side wall of the gate 4. The dielectric spacer region 7 surrounds the side wall of the gate 4 and covers end portions of the poly-silicon semiconductor active region 2, and portions of the poly-silicon semiconductor active region 2 corresponding to the dielectric spacer region 7, i.e., the end portions, comprise a buffer region 8.

In addition, the LTPS transistor array substrate may further comprise a gate insulating layer 3, which is provided between the gate 4 and the poly-silicon semiconductor active region 2 and has the same pattern as the gate 4. In this case, the gate insulating layer 3 and the gate 4 may be formed by one patterning process, thus reducing damage to the gate insulating layer 3 caused by etching, and reducing interface defect between the gate insulating layer 3 and the poly-silicon semiconductor active region 2.

In addition, referring to FIG. 3, an NMOS region of the LTPS transistor array substrate may further comprise a source-drain extension region 5 provided at each of both sides of the poly-silicon semiconductor active region 2, i.e., at a side of the buffer region 8 far away from the poly-silicon semiconductor active region 2. The source-drain extension region 5 may be formed by implanting small amount of P-type or N-type dopant ions, in order to prevent the generation of hot carriers. In addition, the LTPS transistor array substrate may further comprise a source-drain doping region 6 provided at a side of the source-drain extension region 5 far away from the poly-silicon semiconductor active region 2, and the source-drain doping region 6 may be formed by implanting large amount of dopant ions.

On the other hand, referring to FIG. 4, a PMOS region of the LTPS transistor array substrate may further comprise a source-drain doping region 6 provided at each of both sides of the poly-silicon semiconductor active region 2, i.e., a side of the buffer region 8 far away from the poly-silicon semiconductor active region 2, and the source-drain doping region 6 may be formed by implanting large amount of dopant ions.

In the LTPS transistor array substrate of the embodiment of the present invention, since the dielectric spacer region 7 is formed on the side wall of the gate 4, and the buffer region 8 is formed in the portion of the poly-silicon semiconductor active region 2 corresponding to the dielectric spacer region 7, the concentration of the impurity ions in the buffer region 8 may be smaller than that in the source-drain extension region 5 or the source-drain doping region 6 at the outer side thereof (i.e., the side far away from the poly-silicon semiconductor active region 2), and may be larger than that in the poly-silicon semiconductor active region 2 on the inner side thereof (the side close to the poly-silicon semiconductor active region 2), and the buffer region 8 can further reduce the electric field between a junction and a channel region, and separate a position with maximum electric field in the junction from a path with maximum current in the channel, in order to prevent the generation of the hot carriers.

A maximum length of the dielectric spacer region 7 from a side close to the gate 4 to a side far away from the gate 4 is in the range of 0.1 μm to 1 μm. If the length thereof is too small, it cannot prevent the generation of the hot carriers, and if the length is too large, the source and drain cannot be connected.

The dielectric spacer region 7 comprises at least one layer of dielectric material. That is, the dielectric spacer region 7 may comprise a dielectric material obtained by depositing multiple layers. The specific number and thickness of the layers are not limited herein.

The dielectric material may be silicon oxide or silicon nitride. The dielectric spacer region 7 may be formed by depositing silicon oxide or silicon nitride only, or by depositing both of them sequentially or simultaneously. It should be understood that, other dielectric materials in the prior art may also be used.

It should be understood that, the LTPS transistor array substrate may further comprise other necessary functional layers, such as a planarization layer, a pixel electrode, various peripheral metal wires, and the like, which are not elaborated here.

As shown in FIGS. 5 to 10, the embodiments of the present invention further provide a method for fabricating the above described LTPS transistor array substrate, and the method comprises steps 1 to 5 as below.

Step 1 comprises forming a poly-silicon semiconductor active layer on a substrate.

Figure 5:
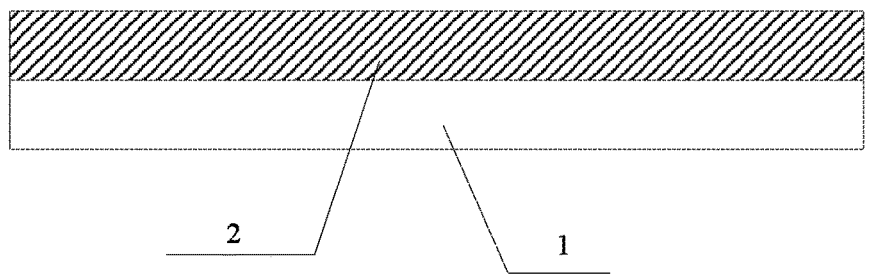
FIG. 5 is a schematic structure diagram of an LTPS transistor array substrate after forming a poly-silicon semiconductor active region according to an embodiment of the present invention.

As shown in FIG. 5, an amorphous silicon layer is deposited on the substrate 1, then dehydrogenation treatment is performed, and crystallization treatment is performed on the amorphous silicon layer by a laser annealing process, a metal induced crystallization process, a solid phase crystallization process, etc., so as to form the poly-silicon semiconductor active layer.

Step 2 comprises forming a gate insulating layer on the poly-silicon semiconductor active layer.

Figure 6:
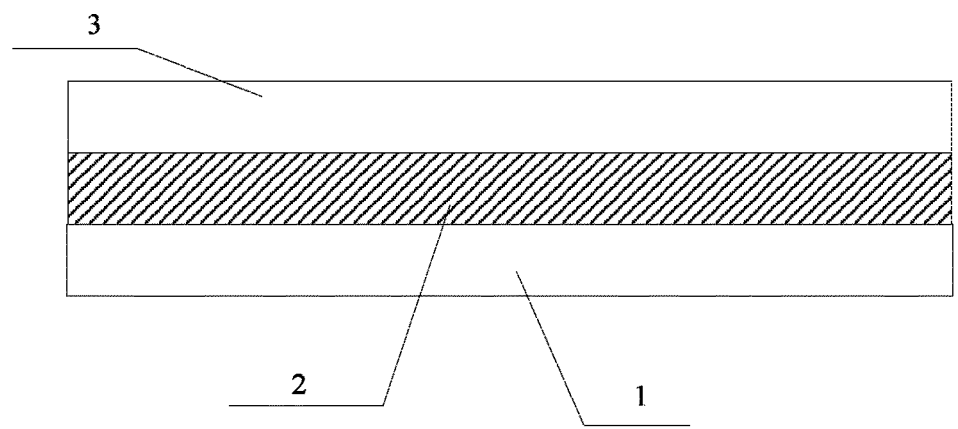
FIG. 6 is a schematic structure diagram of the LTPS transistor array substrate after depositing a gate insulating layer according to the embodiment of the present invention.

As shown in FIG. 6, the gate insulating layer 3 is deposited by a PEVCD method, and the specific method belongs to the prior art and is not elaborated here.

Step 3 comprises forming a gate on the gate insulating layer.

Figure 7:
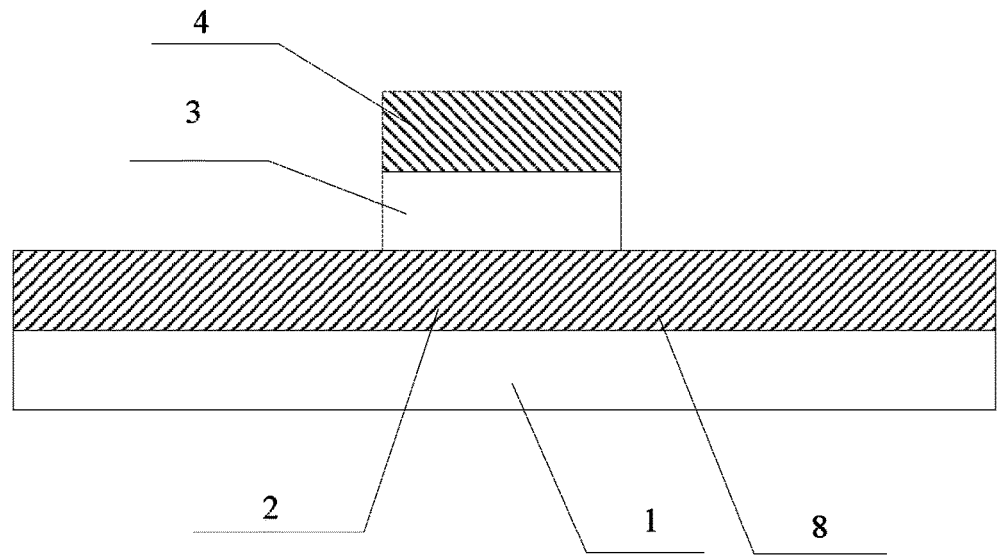
FIG. 7 is a schematic structure diagram of the LTPS transistor array substrate after forming patterns of the gate insulating layer and a gate according to the embodiment of the present invention.

As shown in FIG. 7, a gate metal layer is formed on the gate insulating layer 3 by a sputtering process, and then patterns of the grate 4 and the gate insulating layer 3 are formed by one patterning process. In this way, the insulating layer may be prevented from being influenced too much by etching during the patterning process, so as to prevent the generation of interface detect on an interface in contact with the poly-silicon semiconductor active region 2.

Step 4 comprises forming a dielectric spacer region on a side wall of the gate.

In this step, one or more dielectric material layers are conformally deposited on the substrate formed with the gate 4 by a plasma chemical vapor deposition (PEVCD) method, i.e., the dielectric material layer(s) are deposited on an upper surface of the poly-silicon semiconductor active layer and the side wall and an upper surface of the gate 4, and the dielectric material may be silicon oxide or silicon nitride. It should be understood that, other dielectric material(s) in the prior art may also be used.

Figure 8:
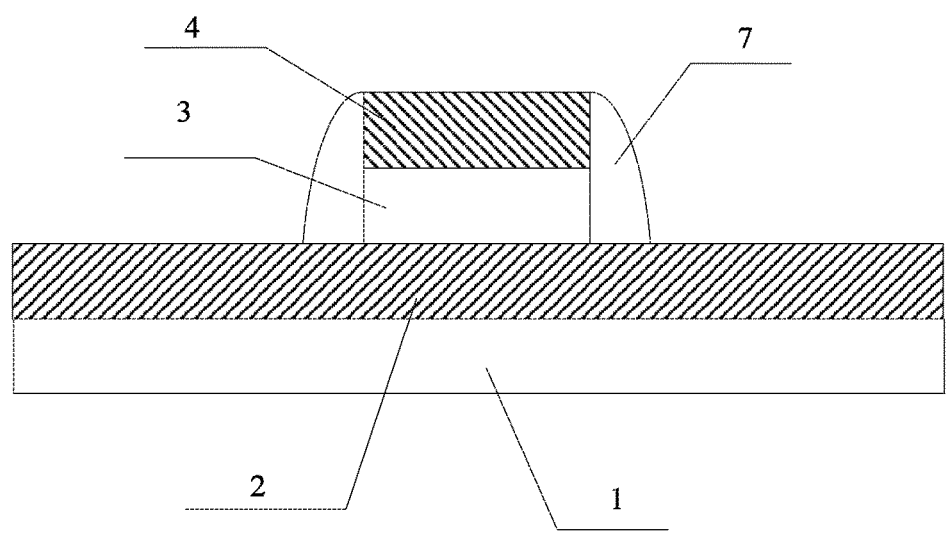
FIG. 8 is a schematic structure diagram of the LTPS transistor array substrate after forming a dielectric spacer region according to the embodiment of the present invention.

Next, as shown in FIG. 8, a patterning process is performed on the dielectric material layer(s) to form the dielectric spacer region 7 on the side wall of the gate 4, and a maximum length of the dielectric spacer region 7 from amide close to the gate 4 to a side far away from the gate 4 is in the range of 0.1 μm to 1 μm. The dielectric spacer region 7 surrounds the side wall of the gate 4 and covers end portions of the poly-silicon semiconductor active region 2. The dielectric spacer region 7 may further protect side walls of the gate insulating layer 3 and the gate 4 from being damaged during subsequent fabrication processes of functional layers.

Step 5 comprises forming a buffer region by ion implantation doping.

Figure 9:
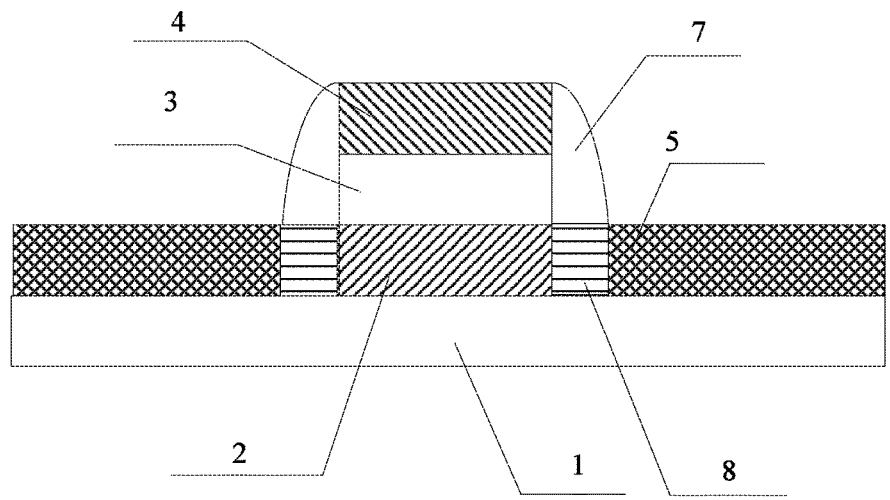
FIG. 9 is a schematic structure diagram of the LTPS transistor array substrate after a first ion implantation according to the embodiment of the present invention.

As shown in FIG. 9, after the pattern of the dielectric spacer region 7 is formed, a poly-silicon semiconductor active region 2 is defined in portions of the poly-silicon semiconductor active layer corresponding to the gate 4 and the dielectric spacer region 7 by ion implantation doping, and a buffer region 8 is formed in a portion of the poly-silicon semiconductor active region 2 corresponding to the dielectric spacer region 7.

Specifically, the substrate 1 is doped by using the gate as a mask to shield the poly-silicon semiconductor active region 2. For an N-type metal-oxide-semiconductor (NMOS) transistor, a source-drain extension region 5 (comprising a formed low-energy shallow junction) is formed by implanting medium or low dose of arsenic ions, in this case, the buffer region 8 is formed in a corresponding portion of the poly-silicon semiconductor active region 2 due to shielding of the dielectric spacer region 7, the concentration of arsenic ions in the buffer region 8 gradually decreases along a direction towards the center of the poly-silicon semiconductor active region 2, so as to form a concentration gradient of arsenic ions, which is more conducive to preventing the generation of hot carriers.

In addition, for the NMOS region, the method further comprises a step of forming a source-drain doping region by implanting large dose of ions.

Figure 10:
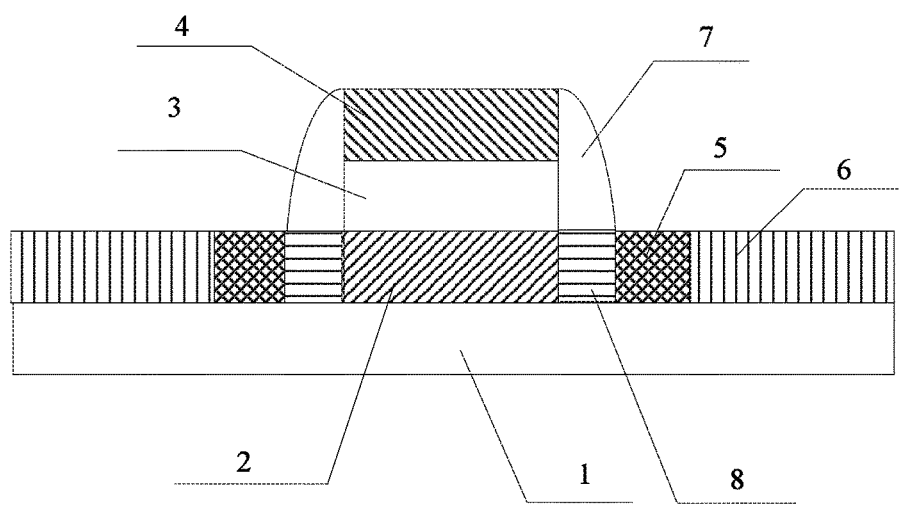
FIG. 10 is a schematic structure diagram of the LTPS transistor array substrate after a second ion implantation according to the embodiment of the present invention.

As shown in FIG. 10, for the NMOS region, the source-drain doping region 6 is formed at a side of the source-drain extension region 5 far away from the poly-silicon semiconductor active region 2 by implanting large dose of ions (i.e., source-drain implanting).

In addition, for a P-type metal-oxide-semiconductor (PMOS) transistor region, a source-drain doping region 6 may be directly formed on each of both sides of the poly-silicon semiconductor active region 2 (i.e., a side of the buffer region far away from the poly-silicon semiconductor active region 2) by implanting large dose of ions, in this case, the buffer region 8 is formed in a corresponding portion of the poly-silicon semiconductor active region 2 due to shielding of the dielectric spacer region 7, and the concentration of arsenic ions in the buffer region 8 gradually decreases along a direction towards the center of the poly-silicon semiconductor active region 2 to form an ion concentration gradient, which is more conducive to preventing the generation of hot carriers.

It should be understood that, the doping method and the dopant ions both fall into the scope of the prior art, and are not elaborated here.

In addition, the method may further comprise steps of sequentially fabricating other necessary functional layers of the LTPS transistor array substrate, and the fabrication methods of these necessary functional layers belongs to the prior art, and are not elaborated here.

The embodiments of the present invention further provide a display device, which comprises the above described LTPS transistor array substrate.

It should be understood that, the foregoing implementations are exemplary implementations merely used for describing the principle of the present invention, but the present invention is not limited thereto. For a person of ordinary skill in the art, various variations and improvements may be made without departing from the spirit and essence of the present invention, and those variations and improvements should also be regarded as falling within the protection scope of the present invention.

What is claimed is:

1. A low temperature poly-silicon transistor array substrate, comprising:
    a substrate;
    a poly-silicon semiconductor active region provided on the substrate;
    a gate insulated from the poly-silicon semiconductor active region; and
    a dielectric sidewall spacer provided on a side wall of the gate, but not covering the top surface of the gate, wherein
    a portion of the poly-silicon semiconductor active region corresponding to the dielectric sidewall spacer comprises a buffer region, and the dielectric sidewall spacer surrounds the side wall of the gate and covers the buffer region;
    the gate is made of metal, and the dielectric sidewall spacer covers the entire side wall of the gate made of metal;
    the low temperature poly-silicon transistor array substrate further comprises a source-drain extension region provided at a side of the buffer region far away from the poly-silicon semiconductor active region, wherein the source-drain extension region comprises a small amount of dopant ions, and projections of the dielectric sidewall spacer and the source-drain extension region on the substrate do not overlap; and
    the low temperature poly-silicon transistor array substrate further comprises a source-drain doping region provided at a side of the source-drain extension region far away from the poly-silicon semiconductor active region, wherein the source-drain doping region comprises a large amount of dopant ions.

2. The low temperature poly-silicon transistor array substrate of claim 1, further comprising a gate insulating layer that is provided between the gate and the poly-silicon semiconductor active region and has the same pattern as the gate.

3. The low temperature poly-silicon transistor array substrate of claim 1, wherein a maximum length of the dielectric sidewall spacer from a side close to the gate to a side far away from the gate is in the range of 0.1 µm to 1 µm.

4. The low temperature poly-silicon transistor array substrate of claim 1, wherein the dielectric sidewall spacer comprises at least one layer of dielectric material.

5. The low temperature poly-silicon transistor array substrate of claim 4, wherein the dielectric material comprises silicon oxide or silicon nitride.

6. A display device, comprising the low temperature poly-silicon transistor array substrate of claim 1.

7. The low temperature poly-silicon transistor array substrate of claim 1, wherein the dopant ions of the source-drain extension region are arsenic ions.

8. The low temperature poly-silicon transistor array substrate of claim 1, wherein concentration of impurity ions in the buffer region is smaller than concentration of impurity ions in the source-drain extension region but larger than concentration of impurity ions in the poly-silicon semiconductor active region, the concentration of impurity ions in the source-drain extension region is smaller than concentration of impurity icons in the source-drain doping region, and the concentration of impurity ions in the buffer region gradually decreases along a direction towards the center of the poly-silicon semiconductor active region to form a concentration gradient of impurity ions.

9. The low temperature poly-silicon transistor array substrate of claim 1, a projection of the buffer region on a plane perpendicular to the substrate is rectangular-shaped.

* * * * *